(12) United States Patent
Chen

(10) Patent No.: US 12,727,500 B2
(45) Date of Patent: Sep. 1, 2026

(54) CHIP MODULE AND METHOD OF FORMING SAME

(71) Applicant: ACT IDENTITY TECHNOLOGY LIMITED, Kwai Chung (HK)

(72) Inventor: Gang Chen, Kwai Chung (HK)

(73) Assignee: ACT IDENTITY TECHNOLOGY LIMITED, New Territories (HK)

( * ) Notice: Subject to any disclaimer, the term of this patent is extended or adjusted under 35 U.S.C. 154(b) by 364 days.

(21) Appl. No.: 18/576,841

(22) PCT Filed: Jul. 7, 2022

(86) PCT No.: PCT/CN2022/104250
§ 371 (c)(1),
(2) Date: Jan. 5, 2024

(87) PCT Pub. No.: WO2023/284616
PCT Pub. Date: Jan. 19, 2023

(65) Prior Publication Data

US 2024/0312897 A1 Sep. 19, 2024

Related U.S. Application Data

(60) Provisional application No. 63/222,560, filed on Jul. 16, 2021.

(51) Int. Cl.
*H10W 70/60* (2026.01)
*H10W 70/67* (2026.01)
(Continued)

(52) U.S. Cl.
CPC ....... *H10W 70/699* (2026.01); *H10W 70/685* (2026.01); *H10W 70/688* (2026.01); *H10W 70/69* (2026.01); *H10W 72/071* (2026.01)

(58) Field of Classification Search
None
See application file for complete search history.

(56) References Cited

U.S. PATENT DOCUMENTS 6,607,135 B1 8/2003 Hirai et al.
10,465,894 B2 * 11/2019 He .......................... F21V 5/04
(Continued)

FOREIGN PATENT DOCUMENTS

CN 102426657 A 4/2012
CN 108292373 A 7/2018
(Continued)

OTHER PUBLICATIONS

Extended European search report dated Jun. 18, 2025, Application No. 22841253.2, 8 pages.

(Continued)

*Primary Examiner* — Michelle Mandala
(74) *Attorney, Agent, or Firm* — Francis J. Maguire; WARE FRESSOLA MAGUIRE & BARBER LLP

(57) ABSTRACT

A chip module (40*a,* 40*b,* 62) is disclosed as including an integrated-circuit (IC) chip (34, 64), a first flexible substrate layer (18) with a number of holes (28), a second adhesive substrate layer (16) with a number of holes (26), and a third substrate layer (14) made of an electrically conductive material, the second substrate layer being sandwiched between and fixedly engaged with the first and third substrate layers, the holes of the first substrate layer and the holes of the second substrate layer being aligned with each other to form a number of cavities (12, 66) each receiving at least a part of the IC chip.

28 Claims, 6 Drawing Sheets

(51) Int. Cl.

| | |
|---|---|
| ***H10W 70/685*** | (2026.01) |
| ***H10W 70/69*** | (2026.01) |
| ***H10W 72/00*** | (2026.01) |

(56) References Cited

U.S. PATENT DOCUMENTS

| | | | | |
|---|---|---|---|---|
| 11,217,506 | B2 * | 1/2022 | Prajuckamol | H10W 40/22 |
| 2003/0209362 | A1 * | 11/2003 | Kasuga | G07F 7/082<br>174/260 |
| 2010/0109663 | A1 * | 5/2010 | Itoi | G01R 33/09<br>324/260 |
| 2017/0017871 | A1 | 1/2017 | Finn et al. | |
| 2019/0384261 | A1 | 12/2019 | Nam et al. | |
| 2020/0134413 | A1 | 4/2020 | Ng et al. | |
| 2021/0081743 | A1 | 3/2021 | Finn et al. | |
| 2021/0104571 | A1 * | 4/2021 | Shohji | H10F 39/811 |

FOREIGN PATENT DOCUMENTS

| | | | |
|---|---|---|---|
| CN | 206757681 | U | 7/2018 |
| CN | 110619379 | A | 12/2019 |
| WO | 2021092532 | A1 | 5/2021 |
| WO | 2021/116048 | A1 | 6/2021 |

OTHER PUBLICATIONS

International Search Report (ISR), International Application No. PCT/CN2022/104250, mailed Aug. 25, 2022, 3 pages.

Written Opinion of the International Searching Authority (ISA/CN), International Application No. PCT/CN2022/104250, mailed Aug. 25, 2022, 4 pages.

Informal Comments on International Search Report & Written Opinion, International Application No. PCT/CN2022/104250, dated Oct. 31, 2022, 4 pages.

Search Report and Written Opinion (IPOS), SG Application No. 11202309429Y, dated Jan. 10, 2026, 6 pages.

Search Report (SR), UAE Application No. P6000115/2024, dated Jan. 8, 2026, 2 pages.

* cited by examiner

CHIP MODULE AND METHOD OF FORMING SAME

FIELD OF THE INVENTION

This invention relates to a chip module, such as an integrated-circuit (IC) chip module, a chip module card inlay with such a chip module, a method of forming such a chip module, and a method of forming such a chip module card inlay.

BACKGROUND OF THE INVENTION

Chip module card inlays are frequently used for the production of smart cards, e.g. credit cards, identity cards, etc. Such cards are used frequently, and may be subjected to warping and bending when carried around by the users or in use. Such warping and bending of the cards may adversely affect the structural integrity and proper functioning of the cards. Furthermore, conventional chip modules in the smart card industry do not provide a flat and uniform top surface, which adversely affect the manufacturing process of chip module card inlays and smart cards. In particular, chip modules are conventionally of a two-level stepped structure or formed with an uneven top housing, as in the chip on board method.

It is thus an object of the present invention to provide a chip module, a chip module card inlay, a method of forming a chip module, and a method of forming a chip module card inlay in which the aforesaid shortcoming is mitigated, or at least to provide a useful alternative to the trade and public.

SUMMARY OF THE INVENTION

According to a first aspect of the present invention, there is provided a chip module including an integrated-circuit (IC) chip, a first substrate layer made at least partly of a flexible material and with a first hole, a second substrate layer made at least partly of an adhesive material and with a second hole, and a third substrate layer made at least partly of an electrically conductive material, wherein said second substrate layer is sandwiched between and fixedly engaged with said first substrate layer and said third substrate layer, wherein said first hole of said first substrate layer and said second hole of said second substrate layer are aligned with each other to form a first cavity, and wherein at least a first part of said IC chip is received within said first cavity.

According to a second aspect of the present invention, there is provided a chip module card inlay including at least one chip module, said chip module including an integrated-circuit (IC) chip, a first substrate layer made at least partly of a flexible material and with a first hole, a second substrate layer made at least partly of an adhesive material and with a second hole, and a third substrate layer made at least partly of an electrically conductive material, wherein said second substrate layer is sandwiched between and fixedly engaged with said first substrate layer and said third substrate layer, wherein said first hole of said first substrate layer and said second hole of said second substrate layer are aligned with each other to form a first cavity, and wherein at least a first part of said IC chip is received within said first cavity.

According to a third aspect of the present invention, there is provided a method of forming a chip module including providing a first substrate layer made at least partly of a flexible material and with a plurality of first holes, providing a second substrate layer made at least partly of an adhesive material and with a plurality of second holes, providing a third substrate layer made at least partly of an electrically conductive material, aligning said first holes of said first substrate layer with said second holes of said second substrate layer to form a plurality of first cavities, sandwiching said second substrate layer between said first substrate layer and said third substrate layer, fixedly engaging said first substrate layer, said second substrate layer and said third substrate layer to form a first layered structure, fixedly engaging at least a first part of an integrated-circuit (IC) chip within one of said first cavities of said first layered structure, and cutting out at least one chip module from said first layered structure fixedly engaged with said IC chip.

According to a fourth aspect of the present invention, there is provided a method of forming a chip module card inlay including forming at least one chip module including providing a first substrate layer made at least partly of a flexible material and with a plurality of first holes, providing a second substrate layer made at least partly of an adhesive material and with a plurality of second holes, providing a third substrate layer made at least partly of an electrically conductive material, aligning said first holes of said first substrate layer with said second holes of said second substrate layer to form a plurality of first cavities, sandwiching said second substrate layer between said first substrate layer and said third substrate layer, fixedly engaging said first substrate layer, said second substrate layer and said third substrate layer to form a first layered structure, fixedly engaging at least a first part of an integrated-circuit (IC) chip within one of said first cavities of said first layered structure, and cutting out at least one chip module from said first layered structure fixedly engaged with said IC chip.

BRIEF DESCRIPTION OF THE DRAWINGS

Embodiments of the present invention will now be described, by way of examples only, with reference to the accompanying drawings, in which.

DESCRIPTION OF THE EMBODIMENTS

Figure 1:
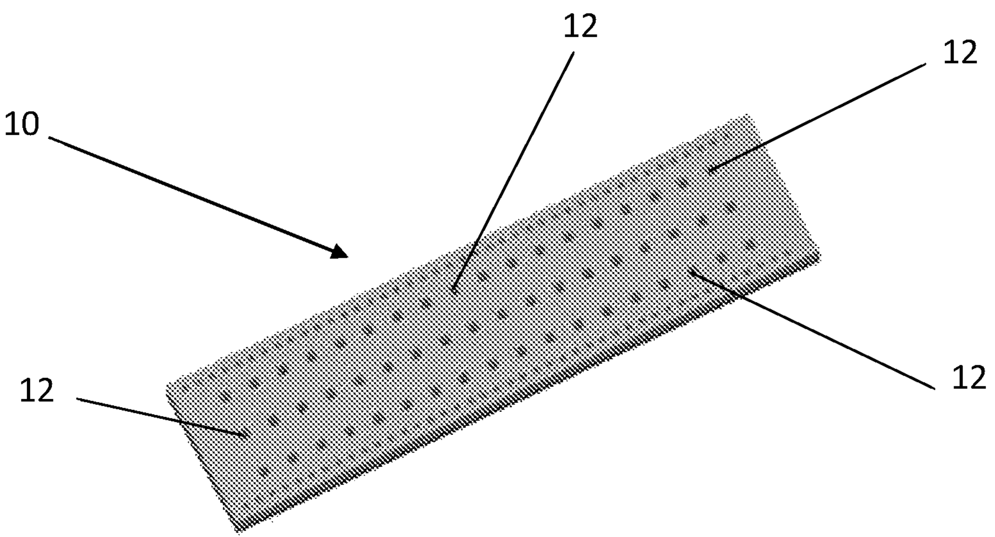
FIG. 1 is a perspective view of a length of chip housing carrier formed of five substrate layers suitable for forming a chip module and a chip module card inlay according to an embodiment of the present invention.

FIG. 1 shows a length of chip housing carrier 10 formed of five substrate layers for forming a chip module and a chip module card inlay according to an embodiment of the present invention. The chip housing carrier 10 is elongate in shape and may be wound around itself in a reel form, and then unwound for subsequent steps for forming the chip module and chip module card inlay. Along the chip housing carrier 10 are formed a number of cavities 12. The cavities 12 may be of a square, rectangular, or circular transverse cross sectional shape. As shown as an example in FIG. 1, the cavities 12 are arranged in three rows, although it should be understood that the chip housing carrier 10 may be formed with other numbers of rows of cavities 12.

Figure 2:
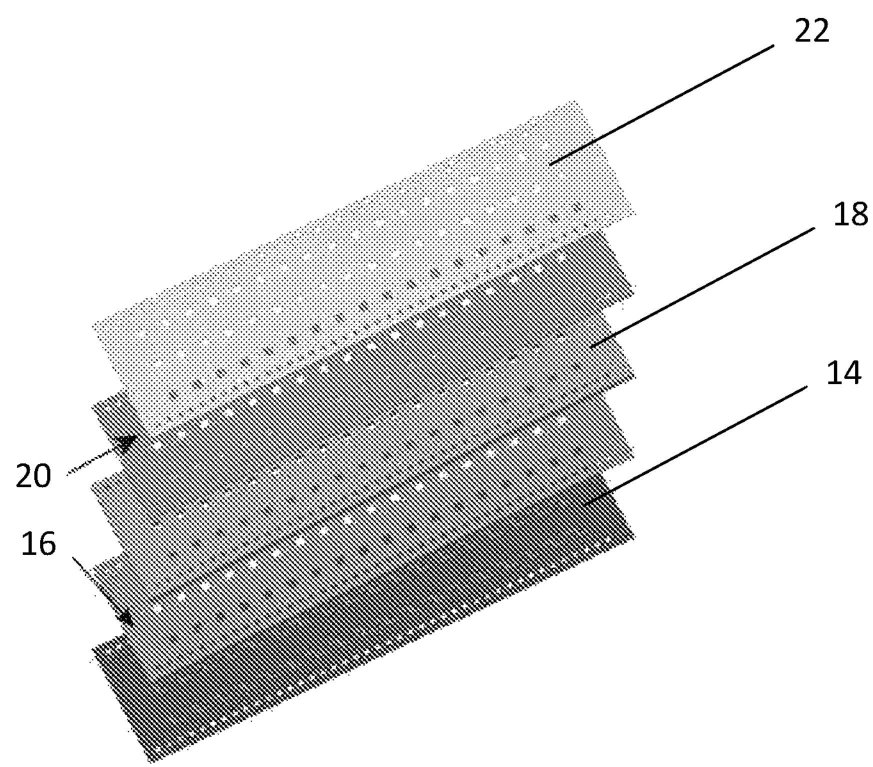
FIG. 2 is a disassembled perspective view of the length of chip housing carrier of FIG. 1.

FIG. 2 is a disassembled perspective view of the length of chip housing carrier 10 shown in FIG. 1. This chip housing carrier 10 according to this embodiment is made of five substrate layers 14, 16, 18, 20, 22 stacked one on top of the other. It should be understood that, according to the present invention, the chip housing carrier 10 may be formed of a different number of substrate layers, e.g. only of the substrate layers 14, 16, 18.

Figure 3:
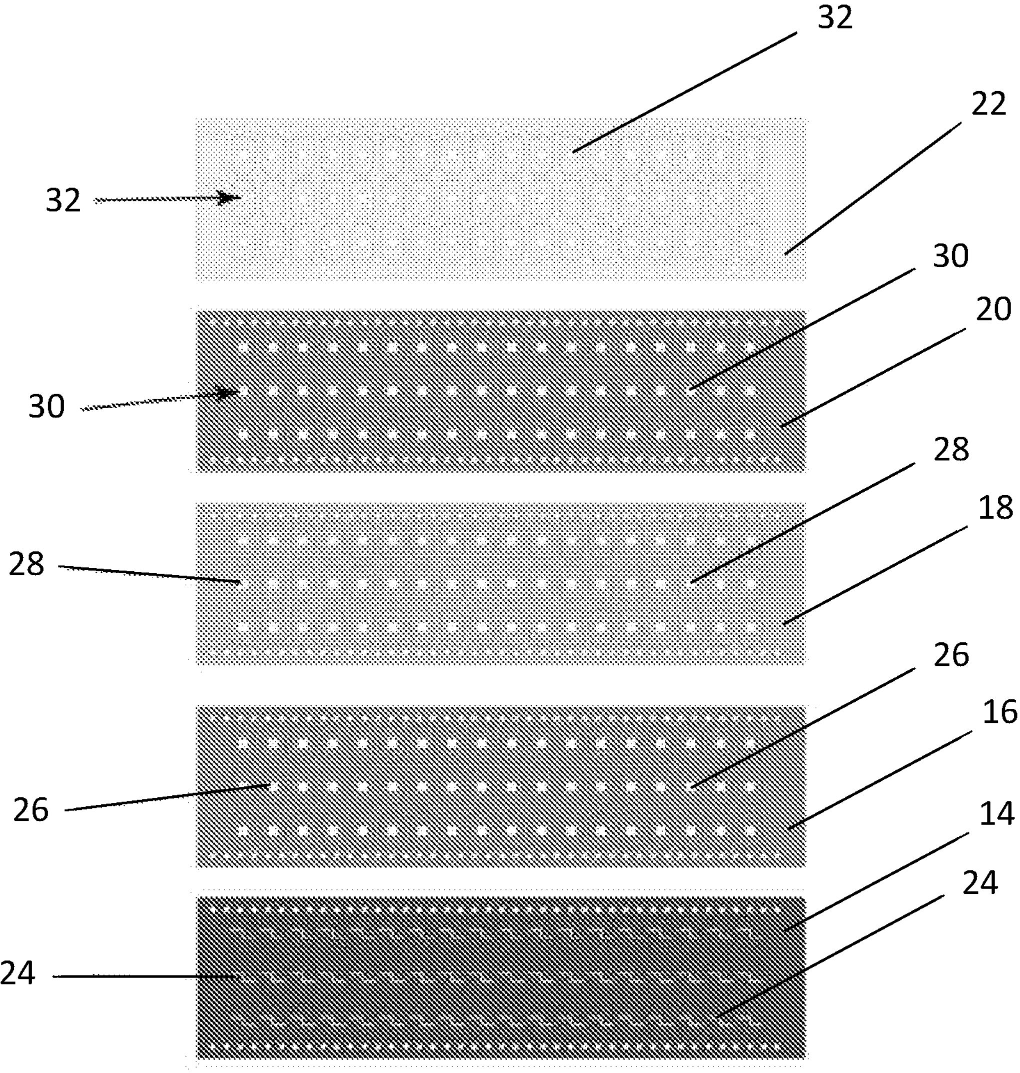
FIG. 3 is a top view of the five substrate layers forming the length of chip housing carrier of FIG. 1.

The five substrate layers 14, 16, 18, 20 and 22 are shown separately in FIG. 3. The substrate layer 14 is made of copper (or other electrically conductive material(s)). Three rows of slits 24 are formed along the length of the substrate layer 14. On top of the substrate layer 14 is the substrate layer 16 with three rows of holes 26 along its length. The substrate layer 16 is made of an adhesive material. On top of the substrate layer 16 is the substrate layer 18 with three rows of holes 28 along its length. The substrate layer 18 is flexible, e.g. being made of a flexible material, such as one or more of polyimide (PI), polyethylene terephthalate (PET), and a glass-reinforced epoxy laminate material (such as "FR-4", which is a composite material composed of woven fiberglass cloth with an epoxy resin binder that is flame resistant).

On top of the substrate layer 18 is the substrate layer 20 with three rows of holes 30 along its length. The substrate layer 20 is made of an adhesive material. On top of the substrate layer 20 is the substrate layer 22 with three rows of holes 32. The substrate layer 22 is made of or electroplated with one or more electrically conductive materials, e.g. copper and nickel.

The holes 26, 28, 30, 32 of the respective substrate layers 16, 18, 20, 22 are of the same size and shape, and are arranged such that when the substrate layers 16, 18, 20, 22 are duly assembled and stacked one on top of another, their respective holes 26, 28, 30, 32 are aligned with one another such that they collectively form a number of cavities 12 extending through the substrate layer 16 to the substrate layer 22. The substrate layer 16 are positioned under and in contact with the substrate layer 14 such that a respective slit 24 is positioned below each cavity 12 formed by a row of the holes 26, 28, 30, 32 aligned with one another.

Figure 4:
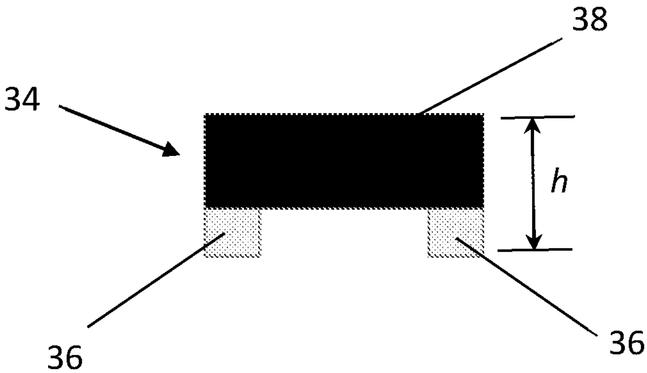
FIG. 4 is a front view of a flipped integrated-circuit (IC) chip.

FIG. 4 shows an integrated-circuit (IC) chip 34. The IC chip 34 may be a contactless chip or other types of chip. In electronics manufacturing, integrated circuit (IC) packaging is the final stage of semiconductor device fabrication, in which the block of semiconductor material is encapsulated in a supporting case (also known as a "package") that prevents physical damage and corrosion. A common plastic used for making the package is epoxy-cresol-novolak (also called "epoxy-cresol-novolac"). In the IC chip 34, two electrically conductive legs 36 are shown as extending and leading from a package 38 of the IC chip 34.

Figure 5:
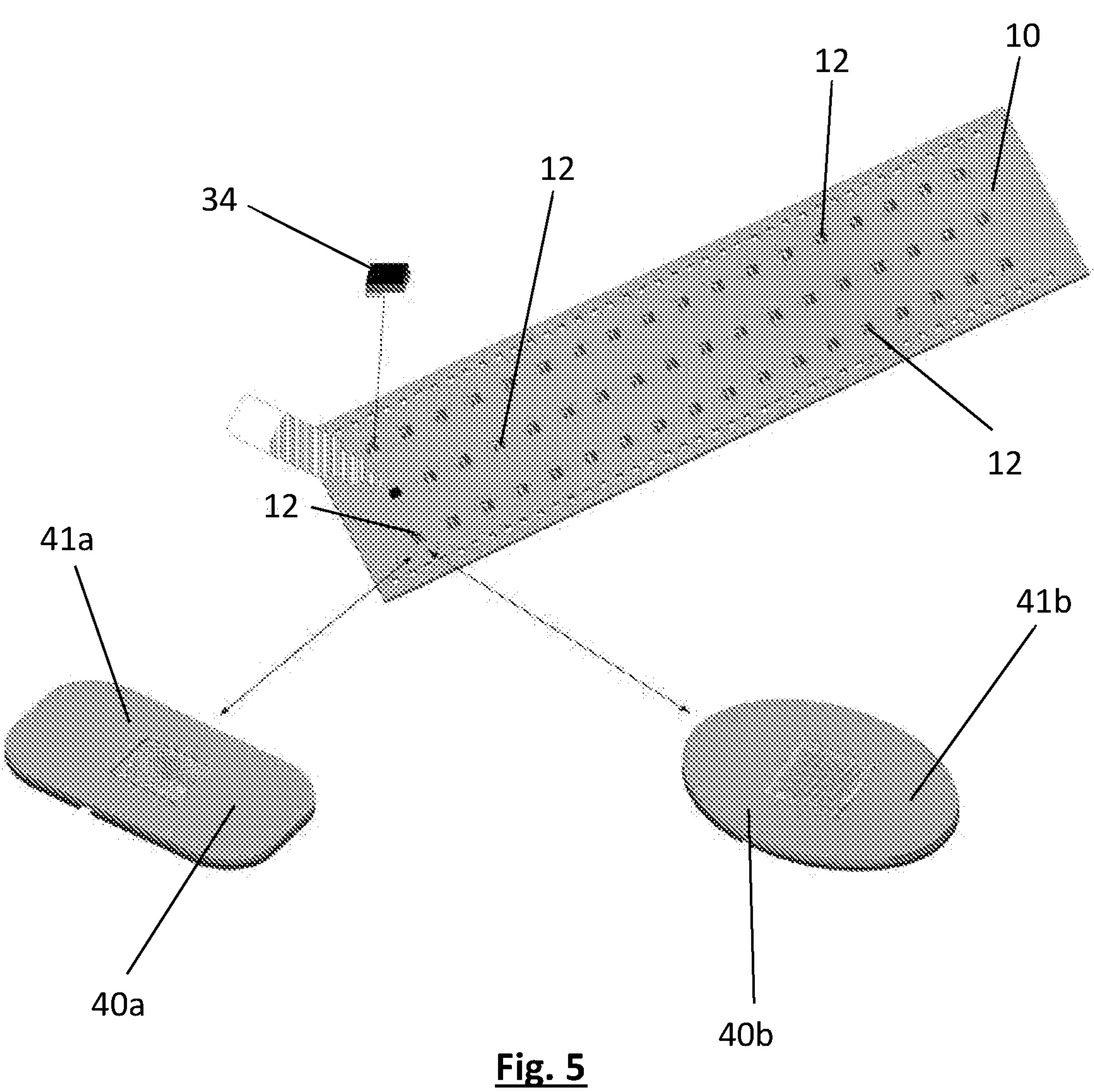
FIG. 5 shows steps of forming chip modules from the length of chip housing carrier of FIG. 1 and the flipped IC chip of FIG. 4.

Turning to FIG. 5, such shows a length of chip housing carrier 10 with a number of cavities 12 formed by the alignment of the holes 26, 28, 30, 32 of the respective substrate layers 16, 18, 20, 22 with the substrate layer 14 forming a bottom. The substrate layers 14, 16, 18, 20, 22 are then laminated to fixedly engaged with one another to form the chip housing carrier 10, which is of a layered-structure. The IC chip 34 is positioned within one of the cavities 12 such that the IC chip 34 is fully received within the cavity 12 with the legs 36 contacting the substrate layer 14 as to establish electrical and physical connection between the legs 36 (and thus the IC chip 34) with the substrate layer 14. The depth of the cavity 12 formed by the alignment of the holes 26, 28, 30, 32 of the substrate layers 16, 18, 20, 22 is no shorter than the total height h of the IC chip 34, with a part of the IC chip 34 received within the cavity formed by the holes 26, 28 and another part of the IC chip 34 received within the cavity formed by the holes 30, 32.

When the IC chip 34 is received within the cavity 12 (and with its legs 36 physically and electrically connected with the substrate layer 14), an adhesive (glue) is filled into any space within the cavity 12 not occupied by the IC chip 34, so as to enhance the fixed engagement of the IC chip 34 within the cavity 12 and with the chip housing carrier 10.

When the IC chips 34 are fixedly engaged with and received within the cavities 12 of the chip housing carrier 10, a plurality of chip modules 40*a*, 40*b* are cut out from the chip housing carrier 10, e.g. by die-cutting. Each of the chip modules 40*a*, 40*b* comprises an IC chip 34 fixedly received within and engaged with the substrate layers 14, 16, 18, 20, 22, with the substrate layer 14 fixedly engaged with the legs 36 of the IC chip 34. The chip modules 40*a*, 40*b* differ with each other in their respective shape, in that the chip module 40*a* is in the shape of a generally rectangular prism, and the chip module 40*b* is in the shape of a generally elliptical cylinder. Generally speaking, the chip modules 40*a*, 40*b* according to the present invention may be in the shape of a prism, a cylinder, or an elliptical cylinder, more particularly, a right prism, a right cylinder, or a right elliptical cylinder, all of a relatively short thickness/height. The two opposite major surfaces of the chip module 40*a* (of which only one of which, 41*a*, is shown in FIG. 5) are planar, of the same shape and parallel with each other. Similarly, the two opposite major surfaces of the chip module 40*b* (of which only one of which, 41*b*, is shown in FIG. 5) are planar, of the same shape and parallel with each other. Thus, the chip modules 40*a*, 40*b* are not in of a two-level stepped structure or formed with an uneven top housing, as in the case of conventional chip modules.

FIGS. 6 to 9 shows steps of forming a chip module card inlay, using the chip module 40*a* as an example.

Figure 6:
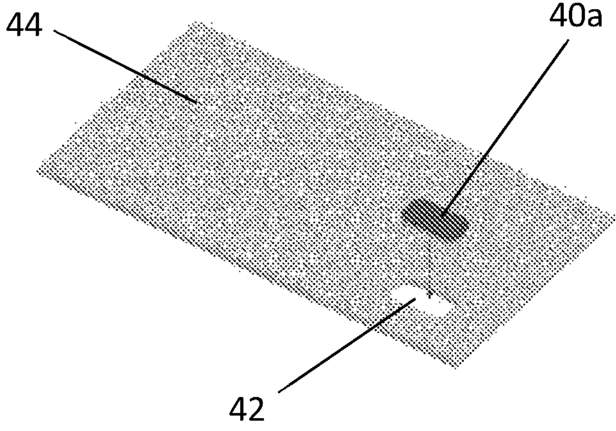
FIGS. 6 to 9 shows steps of forming a chip module card inlay from the chip module formed in FIG. 5.

As shown in FIG. 6, the chip module 40*a* is positioned within a hole 42 of a substrate layer 44, which may be made of a plastic material, such as polycarbonate (PC), polyvinyl chloride (PVC), or polyethylene terephthalate glycol (PETG). In the case of the conventional two-level stepped structured chip modules, at least two such substrate layers (also called "compensation layers") are required, to cater for the different shapes of the two levels. On the other hand, as the chip modules according to the present invention may be in the shape of a prism, a cylinder, or an elliptical cylinder, more particularly, a right prism, a right cylinder, or a right elliptical cylinder, only one compensation layer is required. This facilitates the production of the chip module card inlays (to be discussed below) and subsequently the smart cards.

Figure 7:
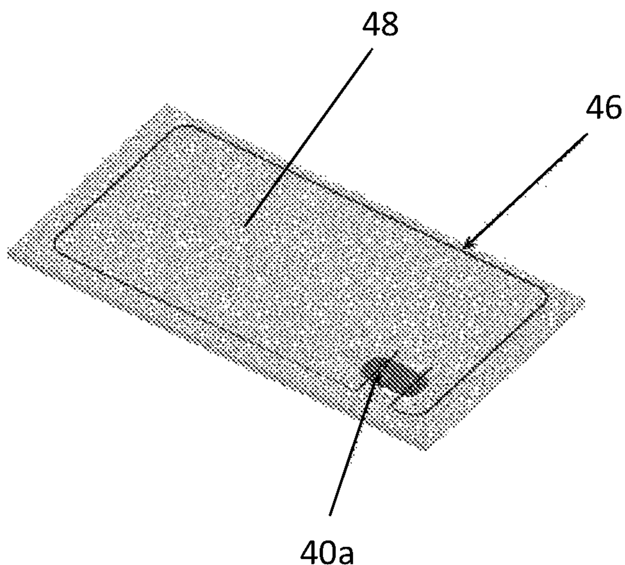
Figure 8:
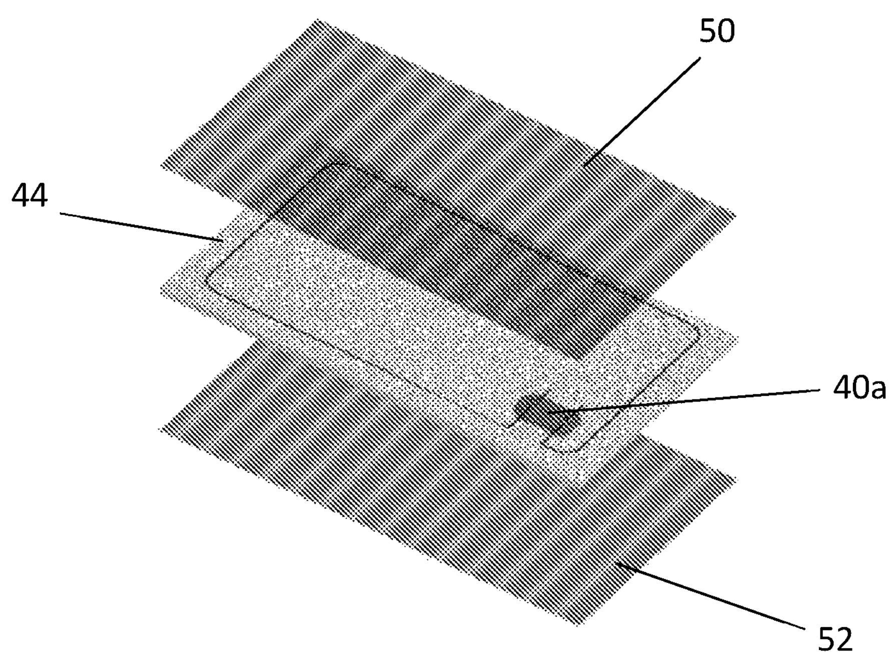
Figure 9:
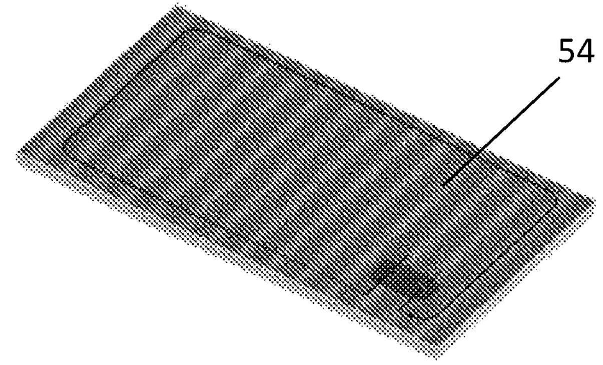

As further shown in FIG. 7, an electrically conductive wire 46 (e.g. made of copper) is embedded on a major surface 48 of the substrate layer 44. The wire 46 may be embedded on the major surface 48 of the substrate layer 44 for several rounds, e.g. to form an antenna. Two free ends of the wire 46 are bonded with the chip module 40*a*, e.g. by thermo-bonding.

The substrate layer 44 is sandwiched between two protective substrate layers 50, 52. The two substrate layers 50, 52 may also be made of PC, PVC or PETG. The substrate layers 44, 50, 52 thus stacked together with one another are then laminated so as to fixedly engage the substrate layers 44, 50, 52 to form a chip module card inlay 54, which is in a layered-structure.

Figure 10:
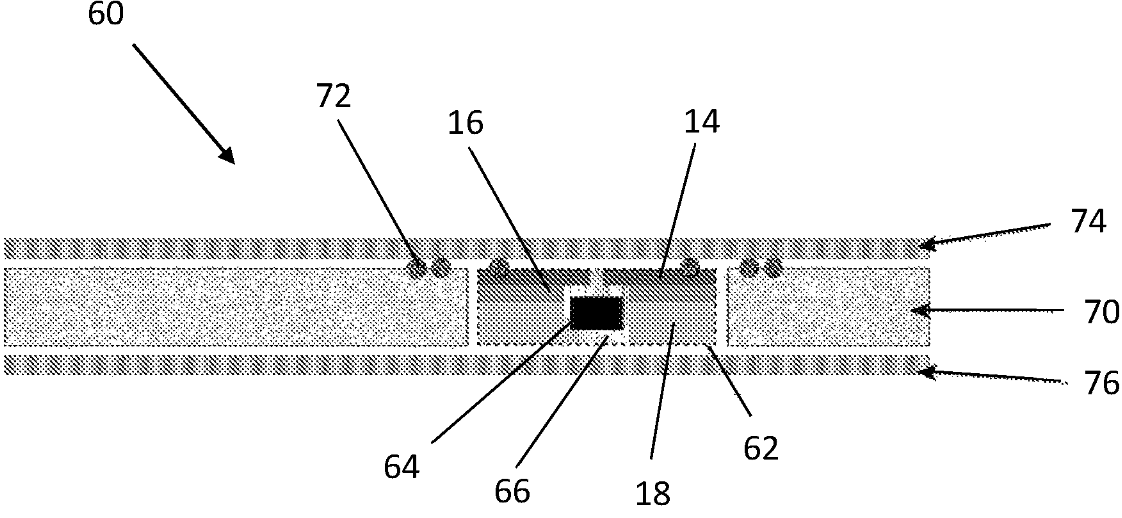
FIG. 10 is a sectional view of a chip module card inlay according to an embodiment of the present invention.

FIG. 10 shows a sectional view of a chip module card inlay 60 with a chip module 62. The chip module 62 has an IC chip 64 received within a cavity 66 formed of alignment of the holes 26, 28 of the respective substrate layers 16, 18. The legs 36 of the IC chip 64 are connected physically and electrically with the substrate layer 14 on top of the substrate layer 16. The substrate layer 16 is thus sandwiched between and fixedly engaged with the substrate layers 14, 18.

The chip module 62 is received within a hole 68 of an inner substrate layer 70, and is electrically connected (e.g. by bonding) to an antenna formed of an electrically conductive wire 72 (which may be made of copper). The inner substrate layer 70 is sandwiched between two outer substrate layers 74, 76. The substrate layers 70, 74, 76 are laminated and thus fixedly engaged with one another to form the chip module card inlay 60 in a layered structure. The depth of the cavity 66 formed by the alignment of the holes 26, 28 of the substrate layers 16, 18 is no shorter than the total height of the IC chip 64.

It should be understood that the above only illustrates and describes examples whereby the present invention may be carried out, and that modifications and/or alterations may be made thereto without departing from the spirit of the invention.

It should also be understood that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The invention claimed is:

1. A chip module including: an integrated-circuit (IC) chip, a first substrate layer made at least partly of a flexible material and with a first hole, a second substrate layer made at least partly of an adhesive material and with a second hole, and a third substrate layer made at least partly of an electrically conductive material, wherein said second substrate layer is sandwiched between and fixedly engaged with said first substrate layer and said third substrate layer, wherein said first hole of said first substrate layer and said second hole of said second substrate layer are aligned with each other to form a first cavity, and wherein at least a first part of said IC chip is received within said first cavity, and wherein said third substrate layer includes at least one slit engaged with a leg of said IC chip to electrically connect said IC chip with said third substrate layer.

2. The chip module of claim 1, wherein said third substrate layer is made at least partly of copper.

3. The chip module of claim 1, wherein said first hole and said second hole are of the same size and shape.

4. The chip module of claim 1, wherein said first substrate layer is made of polyimide (PI), polyethylene terephthalate (PET), and/or a glass-reinforced epoxy laminate material.

5. A chip module including: an integrated-circuit (IC) chip, a first substrate layer made at least partly of a flexible material and with a first hole, a second substrate layer made at least partly of an adhesive material and with a second hole, and a third substrate layer made at least partly of an electrically conductive material, wherein said second substrate layer is sandwiched between and fixedly engaged with said first substrate layer and said third substrate layer, wherein said first hole of said first substrate layer and said second hole of said second substrate layer are aligned with each other to form a first cavity, and wherein at least a first part of said IC chip is received within said first cavity, further including a fourth substrate layer made at least partly of an adhesive material and with a third hole and a fifth substrate layer with a fourth hole, and wherein said third hole and said fourth hole are aligned with each other to form a second cavity, and wherein at least a second part of said IC chip is received within said second cavity.

6. The chip module of claim 5, wherein said third hole and said fourth hole are of the same size and shape.

7. The chip module of claim 5, wherein said fifth substrate layer is made of or electro-plated with an electrically conductive material.

8. The chip module of claim 1, wherein said chip module is in the shape of a prism, a cylinder, or an elliptical cylinder.

9. A chip module card inlay including at least one chip module according to claim 1.

10. The chip module card inlay of claim 9, wherein said chip module is received within a fifth hole of a sixth substrate layer.

11. The chip module card inlay of claim 10, wherein said sixth substrate layer is sandwiched between and fixedly engaged with a seventh substrate layer and an eighth substrate layer.

12. The chip module card inlay of claim 9, wherein said chip module is electrically connected with at least one conductive wire.

13. A method of forming a chip module including: providing a first substrate layer made at least partly of a flexible material and with a plurality of first holes, providing a second substrate layer made at least partly of an adhesive material and with a plurality of second holes, providing a third substrate layer made at least partly of an electrically conductive material, aligning said first holes of said first substrate layer with said second holes of said second substrate layer to form a plurality of first cavities, sandwiching said second substrate layer between said first substrate layer and said third substrate layer, fixedly engaging said first substrate layer, said second substrate layer and said third substrate layer to form a first layered structure, fixedly engaging at least a first part of an integrated-circuit (IC) chip within one of said first cavities of said first layered structure, and cutting out at least one chip module from said first layered structure fixedly engaged with said IC chip, including engaging a leg of said IC chip with at least one slit of said third substrate layer to electrically connect said IC chip with said third substrate layer.

14. The method of claim 13, wherein said third substrate layer is made at least partly of copper.

15. The method of claim 13, wherein said first holes and said second holes are of the same size and shape.

16. The method of claim 13, further including filling at least a part of a space between said first part of said IC chip and said first cavity with an adhesive.

17. The method of claim 13, wherein said first substrate layer is made of polyimide (PI), polyethylene terephthalate (PET), and/or a glass-reinforced epoxy laminate material.

18. A method of forming a chip module including: providing a first substrate layer made at least partly of a flexible material and with a plurality of first holes, providing a second substrate layer made at least partly of an adhesive material and with a plurality of second holes, providing a third substrate layer made at least partly of an electrically conductive material, aligning said first holes of said first substrate layer with said second holes of said second substrate layer to form a plurality of first cavities, sandwiching said second substrate layer between said first substrate layer and said third substrate layer, fixedly engaging said first substrate layer, said second substrate layer and said third substrate layer to form a first layered structure, fixedly engaging at least a first part of an integrated-circuit (IC) chip within one of said first cavities of said first layered structure, and cutting out at least one chip module from said first layered structure fixedly engaged with said IC chip, further including providing a fourth substrate layer made at least partly of an adhesive material and with a plurality of third holes and a fifth substrate layer with a plurality of fourth holes, and further including aligning said third holes of said fourth adhesive substrate layer with said fourth holes of said fifth substrate layer to form a plurality of second cavities, and positioning at least a second part of said IC chip within one of said second cavities.

19. The method of claim 18, wherein said third holes and said fourth holes are of the same size and shape.

20. The method of claim 18, wherein said fifth substrate layer is made of or electro-plated with an electrically conductive material.

21. A method of forming a chip module including: providing a first substrate layer made at least partly of a flexible material and with a plurality of first holes, providing a second substrate layer made at least partly of an adhesive material and with a plurality of second holes, providing a third substrate layer made at least partly of an electrically conductive material, aligning said first holes of said first substrate layer with said second holes of said second substrate layer to form a plurality of first cavities, sandwiching said second substrate layer between said first substrate layer and said third substrate layer, fixedly engaging said first substrate layer, said second substrate layer and said third substrate layer to form a first layered structure, fixedly engaging at least a first part of an integrated-circuit (IC) chip within one of said first cavities of said first layered structure, and cutting out at least one chip module from said first layered structure fixedly engaged with said IC chip, further including providing a fourth substrate layer made at least partly of an adhesive material and with a plurality of third holes and a fifth substrate layer with a plurality of fourth holes, and further including fixedly engaging said fourth adhesive substrate layer and said fifth substrate layer with said first layered structure to form a second layered structure.

22. A method of forming a chip module card inlay including forming at least one chip module according to the method of claim 13.

23. The method of claim 22, including positioning said chip module within a fifth hole of a sixth substrate layer.

24. The method of claim 23, including sandwiching said sixth substrate layer between a seventh substrate layer and an eighth substrate layer, and fixedly engaging said sixth substrate layer, said seventh substrate layer and said eighth substrate layer with one another.

25. The method of claim 22, including electrically connecting said chip module with at least one conductive wire.

26. A chip module card inlay including at least one chip module according to claim 5.

27. A method of forming a chip module card inlay including forming at least one chip module according to the method of claim 18.

28. A method of forming a chip module card inlay including forming at least one chip module according to the method of claim 21.

* * * * *